United States Patent
Qin

(10) Patent No.: US 9,329,449 B2
(45) Date of Patent: May 3, 2016

(54) DISPLAY PANEL, DISPLAY APPARATUS AND METHOD FOR MANUFACTURING DISPLAY PANEL

(71) Applicant: BOE TECHNOLOGY GROUP CO., LTD., Beijing (CN)

(72) Inventor: Wei Qin, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/313,581

(22) Filed: Jun. 24, 2014

(65) Prior Publication Data
US 2015/0279914 A1  Oct. 1, 2015

(30) Foreign Application Priority Data

Mar. 28, 2014 (CN) .......................... 2014 1 0124467

(51) Int. Cl.
| H01L 29/04 | (2006.01) |
| G02F 1/1368 | (2006.01) |
| H01L 51/00 | (2006.01) |
| H01L 27/32 | (2006.01) |
| G02F 1/1362 | (2006.01) |
| G02F 1/1335 | (2006.01) |

(52) U.S. Cl.
CPC .......... G02F 1/1368 (2013.01); H01L 27/3267 (2013.01); H01L 51/0024 (2013.01); *G02F 1/136286* (2013.01); *G02F 2001/133562* (2013.01); *G02F 2001/133567* (2013.01); *G02F 2201/40* (2013.01)

(58) Field of Classification Search
CPC ............... H01L 23/535; G02F 1/1368; G02F 1/136213; G02F 1/136286; G02F 1/134336
USPC ........................................ 257/40, 87, 89, 98
See application file for complete search history.

(56) References Cited

U.S. PATENT DOCUMENTS

| 2014/0078433 A1* | 3/2014 | Li | G02F 1/134336 349/42 |
| 2014/0146246 A1* | 5/2014 | Ma | G06F 3/0412 349/12 |
| 2014/0300847 A1* | 10/2014 | Liu | G02F 1/133528 349/103 |
| 2015/0103267 A1* | 4/2015 | Zhang | H05F 1/00 349/12 |

FOREIGN PATENT DOCUMENTS

| CN | 1550856 A | 12/2004 |
| CN | 1961437 A | 5/2007 |
| CN | 203894508 U | 10/2014 |
| JP | 2006058908 A | 2/2006 |
| WO | 9807066 A1 | 2/1998 |

OTHER PUBLICATIONS

Chinese Office Action including English translation dated Jan. 15, 2016, for corresponding Chinese Application No. 201410124467.7.

* cited by examiner

*Primary Examiner* — Dung Le
(74) *Attorney, Agent, or Firm* — Kinney & Lange, P.A.

(57) ABSTRACT

A display panel comprising a first array substrate and a second array substrate assembled with each other, wherein the first array substrate comprises a plurality of first pixel units arranged in an array of rows and columns, and a gap zone is defined between two adjacent first pixel units in the same row of the array; and the second array substrate comprises a plurality of second pixel units corresponding to gap zones of the first array substrate, respectively. The present invention also discloses a display apparatus and a method for manufacturing the display panel.

13 Claims, 5 Drawing Sheets

DISPLAY PANEL, DISPLAY APPARATUS AND METHOD FOR MANUFACTURING DISPLAY PANEL

CROSS-REFERENCE TO RELATED APPLICATION

This application claims the benefit of Chinese Patent Application No. 201410124467.7 filed on Mar. 28, 2013 in the State Intellectual Property Office of China, the whole disclosure of which is incorporated herein by reference.

BACKGROUND OF THE INVENTION

1. Field of the Invention

Embodiments of the present invention relates to a display technology field, more particularly, relates to a display panel, a display apparatus and a method for manufacturing a display panel.

2. Description of the Related Art

In the prior art, a liquid crystal display panel generally comprises an array substrate and a color filter substrate assembled with the array substrate. The array substrate comprises a plurality of pixel units defined by a set of data lines extending in a first direction and a set of gate lines extending in a second direction. The plurality of pixel units are arranged in an array on the array substrate. Each of the plurality of pixel units comprises a thin film transistor (TFT). The color filter substrate comprises a color filter. As for a liquid crystal display, the TFTs on the display panel are driven by a gate drive circuit, so as to control pixels to display a picture.

When the liquid crystal display is turned on, a coupling capacitance is generated at each of overlaps among the data lines, the gate lines and other electrodes. In order to increase the resolution of the liquid crystal display, especially for the large size liquid crystal display, it needs to add a large number of data lines and gate lines, increasing the coupling capacitances among the data lines and the gate lines. Thereby, a load of the gate driving circuit becomes larger, and a voltage signal of the gate driving circuit is sharply attenuated, causing a turning-on current Ion of the TFT insufficient, decreasing an on-off ratio of the TFT. As a result, the gate driving circuit cannot supply an enough voltage to each pixel, causing charging rate of each pixel insufficient, and decreasing the display quality of the liquid crystal display.

SUMMARY OF THE INVENTION

The present invention has been made to overcome or alleviate at least one aspect of the above mentioned disadvantages.

According to an object of the present invention, there is provided a display panel, a display apparatus and a method for manufacturing a display panel capable of reducing coupling capacitances among data lines on each gate line and the gate line, and improving the display quality.

According to an aspect of the present invention, there is provided a display panel comprising a first array substrate and a second array substrate assembled with each other, wherein the first array substrate comprises a plurality of first pixel units arranged in an array of rows and columns, and a gap zone is defined between two adjacent first pixel units in the same row of the array; and the second array substrate comprises a plurality of second pixel units corresponding to gap zones of the first array substrate, respectively.

According to another aspect of the present invention, there is provided a display apparatus comprising a display panel according to any one of the above exemplary embodiments.

According to another aspect of the present invention, there is provided a method for manufacturing a display panel, comprising steps of:

forming a plurality of first pixel units on a first array substrate in an array of rows and columns, wherein a gap zone is defined between two adjacent first pixel units in the same row of the array;

forming a plurality of second pixel units on a second array substrate corresponding to gap zones of the first array substrate, respectively; and assembling the first array substrate and the second array substrate to form a box structure.

BRIEF DESCRIPTION OF THE DRAWINGS

The above and other features of the present invention will become more apparent by describing in detail exemplary embodiments thereof with reference to the accompanying drawings, in which.

REFERENCES LIST

Figure 1:
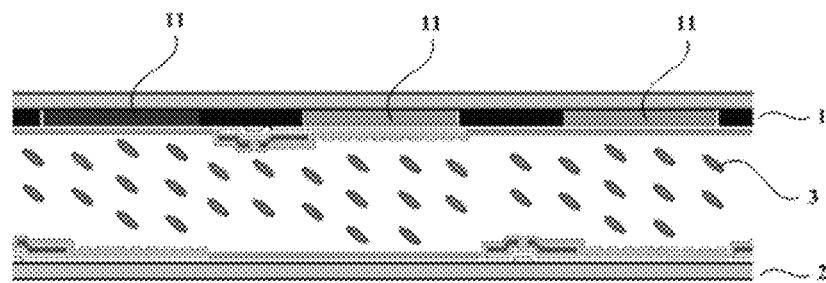
FIG. 1 is an illustrative cross section view of a display panel according to a first exemplary embodiment of the present invention.

| | |
|---|---|
| 1-first array substrate | 11-color filter |
| 12-first TFT | 13-first electrode |
| 14-first gate line | 15-first data line |
| 16-first organic light-emitting layer | 17-first flat layer |
| 2-second array substrate | 22-second TFT |
| 23-second electrode | 24-second gate line |
| 25-second data line | 26-second organic light-emitting layer |
| 27-second flat layer | |
| 3-liquid crystal layer | 4-driving circuit |

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided a display panel comprising a first array substrate and a second array substrate assembled with the first array substrate, wherein the first array substrate comprises a plurality of first pixel units arranged in an array of rows and columns, and a gap zone is defined between two adjacent first pixel units in the same row of the array; and the second array substrate comprises a plurality of second pixel units arranged to correspond to the gap zones of the first array substrate, respectively.

Figure 2:
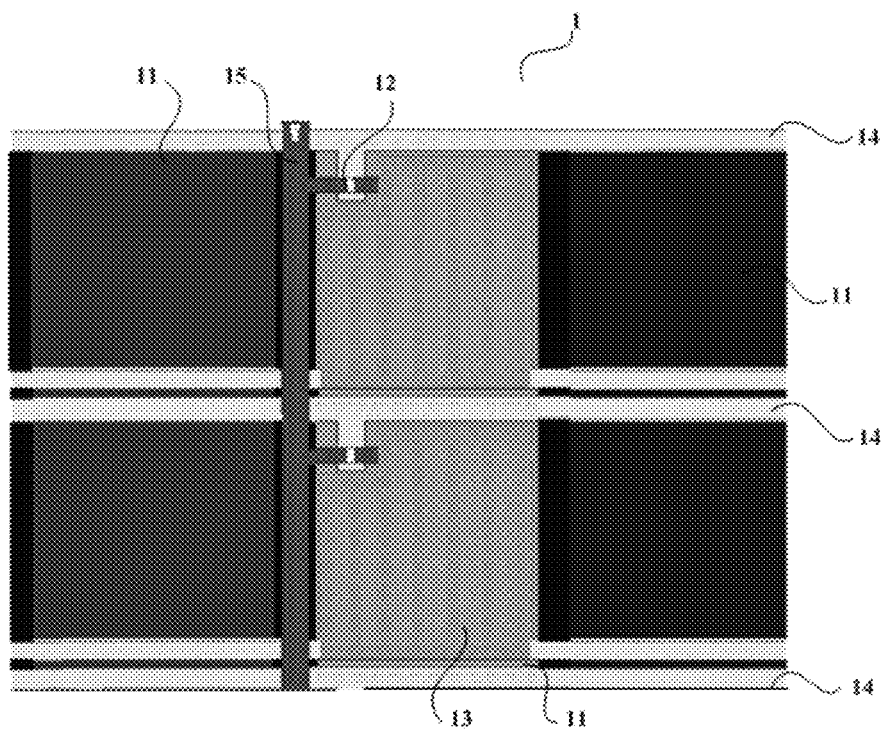
FIG. 2 is an illustrative plan view of a first array substrate of the display panel of FIG. 1.
Figure 3:
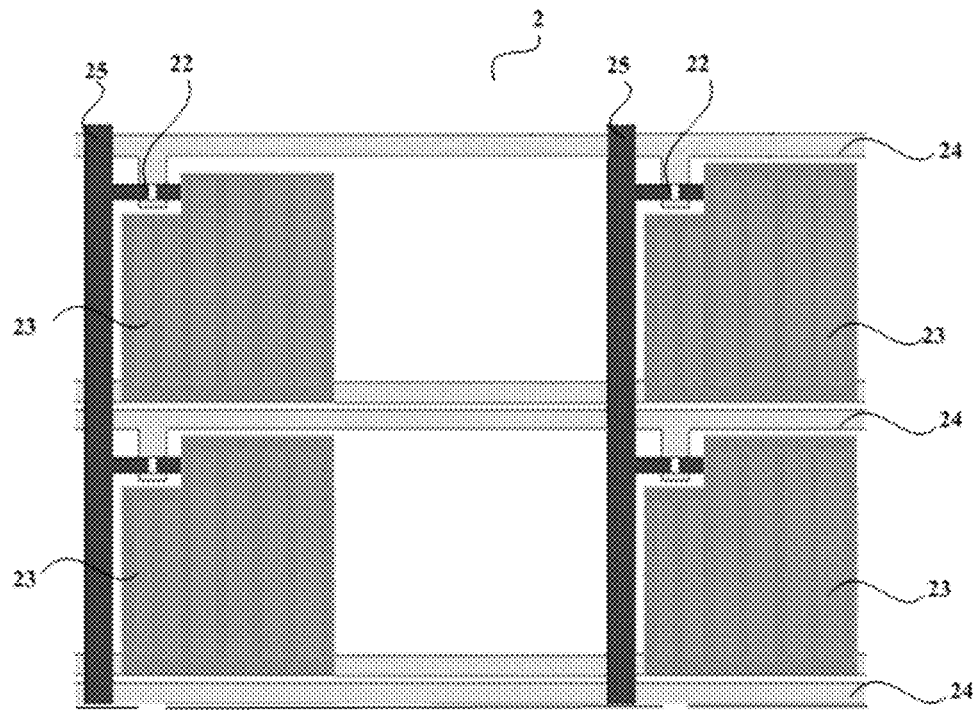
FIG. 3 is an illustrative plan view of a second array substrate of the display panel of FIG. 1.

As shown in FIGS. 1-3, in an exemplary embodiment of the present invention, a display panel comprises a first array substrate 1 and a second array substrate 2. As shown in FIG. 1, the first array substrate 1 and the second array substrate 2 are assembled together to form a box structure.

As shown in FIG. 2, the first array substrate 1 comprises a plurality of first pixel units arranged in an array of rows and columns, and a gap zone is defined between two adjacent first pixel units in the same row of the array. Also, the first array substrate 1 further comprises first data lines 15 extending in a first direction and disposed to correspond to each column of first pixel units, and first gate lines 14 extending in a second direction and disposed to correspond to each row of first pixel units.

As shown in FIG. 3, the second array substrate 2 comprises a plurality of second pixel units corresponding to gap zones of the first array substrate 1, respectively. That is, the plurality of second pixel units are also arranged on the second array substrate 2 in an array of rows and columns. Also, the second array substrate 2 further comprises second data lines 25 extending in the first direction and disposed to correspond to each column of second pixel units, and second gate lines 24 extending in the second direction and disposed to correspond to each row of second pixel units.

In an exemplary embodiment of the present invention, the gap zone is equal to or larger than the second pixel unit in size. The second pixel units on the second array substrate are positioned to correspond to the gap zones between adjacent first pixel units in the same row of the array on the first array substrate, respectively. That is, the vertical projections of the first and second pixel units on the first array substrate, the second array substrate or a plane parallel to the first or second array substrate are not coincided with each other. In an exemplary embodiment of the present invention, the first pixel unit is configured to be same or equivalent to the second pixel unit. The vertical projections of the plurality of first pixel units and the plurality of second pixel units on the first array substrate or the second array substrate are arranged in an array.

In this first embodiment, the first array substrate comprises the plurality of first pixel units arranged in an array of rows and columns, and the gap zone is defined between adjacent first pixel units in the same row of the array, and the second array substrate comprises the plurality of second pixel units arranged to correspond to the gap zones of the first array substrate, respectively. In other words, all pixel units for the display panel are disposed on two array substrates, instead of being disposed on the same array substrate. Thereby, the number of the pixel units on each of the first and second substrates is reduced about half as before, and the number of the pixel units connected to each of gate lines is reduced, decreasing the coupling capacitances as a load among data lines on each gate line and the gate line. As a result, attenuation of a signal on each gate line is weakened, ensuring a turning-on current Ion of a TFT sufficient, increasing a charging rate of each pixel, and improving display quality of the liquid crystal display.

Referring to FIGS. 2-3 again, in an exemplary embodiment, the first array substrate 1 comprises N rows and M columns of first pixel units, and the gap zone is defined between adjacent first pixel units in the same row of the array. The second array substrate 2 comprises a plurality of second pixel units corresponding to gap zones of the first array substrate 1, respectively. That is, the first array substrate 1 comprises N rows and M columns of first pixel units, the second array substrate 2 comprises N rows and (M−1) columns of second pixel units, and each column of second pixel units on the second array substrate 2 is positioned to aligned with the gap zone between adjacent columns of first pixel units on the first array substrate 1 in a thickness direction of the display panel.

In order to display a picture, each of the first pixel units of the display panel comprises a first TFT 12, and each of the second pixel units of the display panel comprises a second TFT 22.

In an exemplary embodiment, the work process of the display panel may be described as follows.

A gate driving circuit supplies a driving voltage to the first gate lines 14 of the first array substrate 1 line by line and the second gate lines 24 of the second array substrate 2 line by line, at the same time, a data signal circuit supplies a data signal voltage to M columns of first data lines 15 of the first array substrate 1 and (M−1) columns of second data lines 25 of the second array substrate 2.

According to the above operation process, since the first array substrate and the second array substrate of the display panel both comprise pixel units, the total number of the pixel units of the display panel is equal to (2M−1)×N. When the gate driving circuit supplies the driving voltage to both the nth row of first gate line of the first array substrate and the nth row of second gate line of the second array substrate, the number of the data lines on the nth row of first gate line of the first array substrate is equal to M, that is, the number of coupling capacitances generated among the data lines on the nth row of first gate line and the nth row of first gate line is equal to M; and the number of the data lines on the nth row of second gate line of the second array substrate is equal to (M−1), that is, the number of coupling capacitances generated among the data lines on the nth row of second gate line and the nth row of second gate line is equal to (M−1).

In the prior art, since all pixel units are disposed on a single array substrate, if the total number of the pixel units of the display panel in the prior art also is equal to (2M−1)×N, there are N rows and (2M−1) columns of pixel units arranged on the single array substrate in the prior art. In this case, when the gate driving circuit supplies the driving voltage to the nth row of gate line of the single array substrate, the number of the data lines on the nth row of gate line of the single array substrate is equal to (2M−1), that is, the number of coupling capacitances generated among the data lines on the nth row of gate line and the nth row of gate line is equal to (2M−1).

According to the above analysis, compared with the display panel of the prior art, the display panel according to the above embodiments of the present invention reduces the number of the pixel units connected to each of gate lines to be about half as before, decreasing the coupling capacitances acted as a load among data lines on each gate line and the gate line. As a result, attenuation of a signal on each gate line is weakened, ensuring a turning-on current Ion of a TFT sufficient, increasing a charging rate of each pixel, and improving display quality of the liquid crystal display.

In an exemplary embodiment of the present invention, the display panel is adapted to be served as a liquid crystal display panel or an organic electroluminescence display (OLED) panel.

Please refer to FIGS. 1-3 again, in an exemplary embodiment of the present invention, the display panel is the liquid crystal display. A liquid crystal layer 3 is filled in a chamber defined between the first array substrate 1 and the second array substrate 2. Each of the first pixel units of the first array substrate 1 comprises a first electrode 13, and each of the second pixel units of the second array substrate 2 comprises a second electrode 23. The first electrode 13 and the second electrode 23 both comprise a pixel electrode. Also, the first array substrate 1 or the second array substrate 2 may further comprise a color filter 11 located between a substrate and the pixel electrode. The color filter 11 generally comprises a red filter resin (R) layer, a green filter resin (G) layer and a blue filter resin (B) layer.

Figure 4:
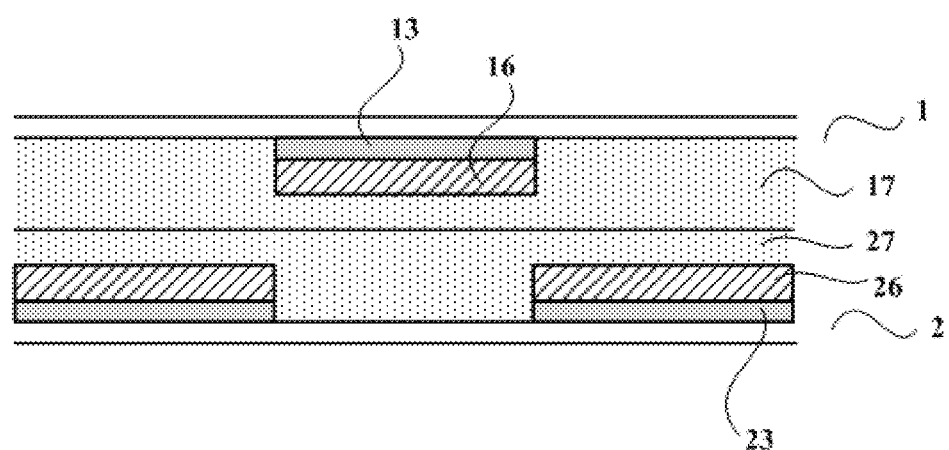
FIG. 4 is an illustrative cross section view of a display panel according to a second exemplary embodiment of the present invention.
Figure 5:
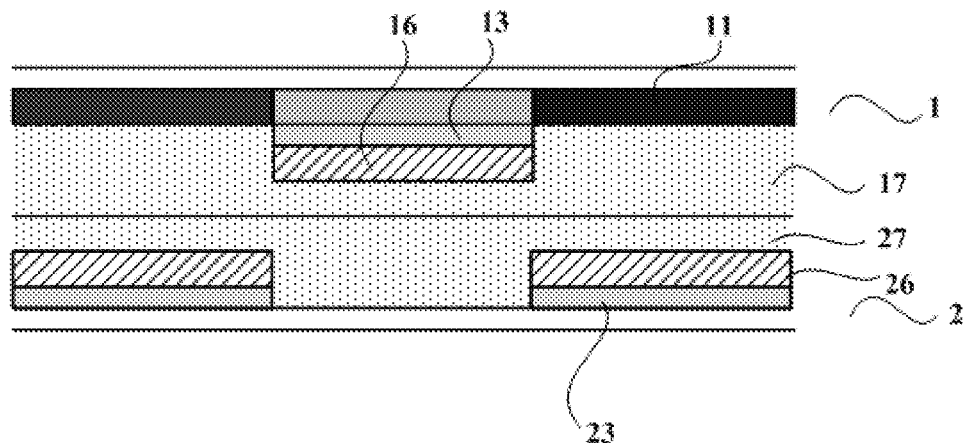
FIG. 5 is an illustrative cross section view of a display panel according to a third exemplary embodiment of the present invention.

As shown in FIGS. 4-5, in another exemplary embodiment of the present invention, the display panel is the OLED panel. Each of the first pixel units of the first array substrate 1 comprises a first electrode 13 and a first organic light-emitting layer 16 underneath the first electrode 13. Each of the second pixel units of the second array substrate 2 comprises a second electrode 23 and a second organic light-emitting layer 26 above the second electrode 23. The first electrode 13 may be configured as a transparent electrode, and the second electrode 23 may be configured as a reflection electrode.

Also, in the OLED panel of this embodiment, the first electrode 13 of the first array substrate 1 is the transparent electrode. In the case that the first array substrate 1 further comprises a reflecting electrode underneath the first organic light-emitting layer 16, a light emitted from the first organic light-emitting layer 16 passes through the transparent electrode and exits out of the first array substrate 1. The second electrode 23 of the second array substrate 2 is the reflection electrode, and a light emitted from the second organic light-emitting layer 26 is reflected to the first array substrate 1 by the reflection electrode and exits out of the first array substrate 1. In this way, the OLED panel may achieve display operation.

Referring to FIG. 4 again, in an exemplary embodiment of the present invention, the first array substrate 1 further comprises a first flat layer 17 formed underneath the first organic light-emitting layer 16 and covering the first array substrate 1, and the second array substrate 2 further comprises a second flat layer 27 formed above the second organic light-emitting layer 26 and covering the second array substrate 2.

Accordingly, in this exemplary embodiment, after the first array substrate 1 and the second array substrate 2 are assembled together, a sealed chamber can be defined between the first array substrate 1 and the second array substrate 2, preventing organic light-emitting material received in the sealed chamber from being disadvantageously affected by oxygen and moisture, improving the display quality of the display panel.

In an exemplary embodiment of the present invention, the first flat layer 17 and the second flat layer 27 may be both formed of the same material. In another exemplary embodiment of the present invention, the first flat layer 17 and the second flat layer 27 may be formed of different materials. In order to simplify the production process and reduce the production devices, the first flat layer and the second flat layer both are formed of the same material.

In the embodiments of the present invention, there are not specifically limitation on materials for forming the first flat layer 17 and the second flat layer 27. An optical adhesive is colorless and transparent, and the optical adhesive generally has a light transmission ratio of above 90%, exhibits good bond strength, is capable of being cured at a room temperature or a moderate temperature, and has small contraction after being cured. Thereby, in an exemplary embodiment of the present invention, the first flat layer and the second flat layer may be formed of, but not limited to, the optical adhesive.

The optical adhesive suitable for the first and second flat layers comprises but is not limited to organic silicon rubber, acrylic resin and unsaturated polyester, polyurethane, epoxy resin, etc. In this way, after the first array substrate and the second array substrate are assembled together, the first array substrate and the second array substrate can be reliably bonded with each other by the optical adhesive, simplifying the production process, and improving the display quality of the display panel.

As shown in FIG. 5, in an exemplary embodiment of the present invention, in order to achieve the color display of the OLED panel, the first array substrate 1 further comprises a color filter 11 located between a substrate of the first array substrate 1 and the first electrode 13. In this embodiment, the first organic light-emitting layer and the second organic light-emitting layer of the display panel may be configured to be a white organic light-emitting layer, so as to omitting a step of etching metal mask during forming the organic light-emitting layer. As a result, it is especially suitable for the color display of the large size OLED panel. When a light emitted from the first organic light-emitting layer and the second organic light-emitting layer passes through the color filter of the first array substrate and exits out of the first array substrate, the color display of the OLED panel can be achieved.

Please be noted that the above embodiment is only an illustrative example for the color display of the OLED panel of the present invention, and the present invention is not limited to the illustrative example. For example, in another exemplary embodiment of the present invention, the first organic light-emitting layer and the second organic light-emitting layer may be configured to be a color light-emitting layer comprising red light-emitting layers (R), green light-emitting layers (G) and blue light-emitting layers (B).

Figure 6:
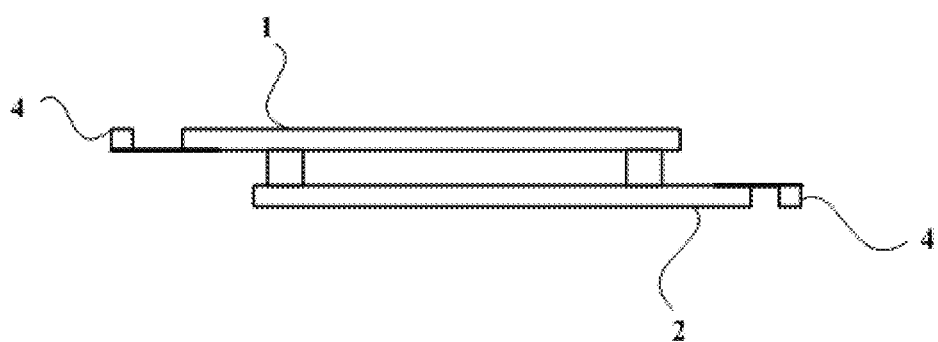
FIG. 6 is an illustrative cross section view of a display panel according to a fourth exemplary embodiment of the present invention.

In order to achieve an electrical connection between the display panels according to various exemplary embodiments of the present invention and a driving circuits 4 for the display panels, as shown in FIG. 6, in an exemplary embodiment of the present invention, the first array substrate 1 further comprises a first electrical connection region for electrically connecting a driving circuit 4 for the display panel, and the second array substrate 2 further comprises a second electrical connection region for electrically connecting the driving circuit 4. As shown in FIG. 6 the first electrical connection region and the second electrical connection region are disposed on different sides of the display panel.

Figure 7:
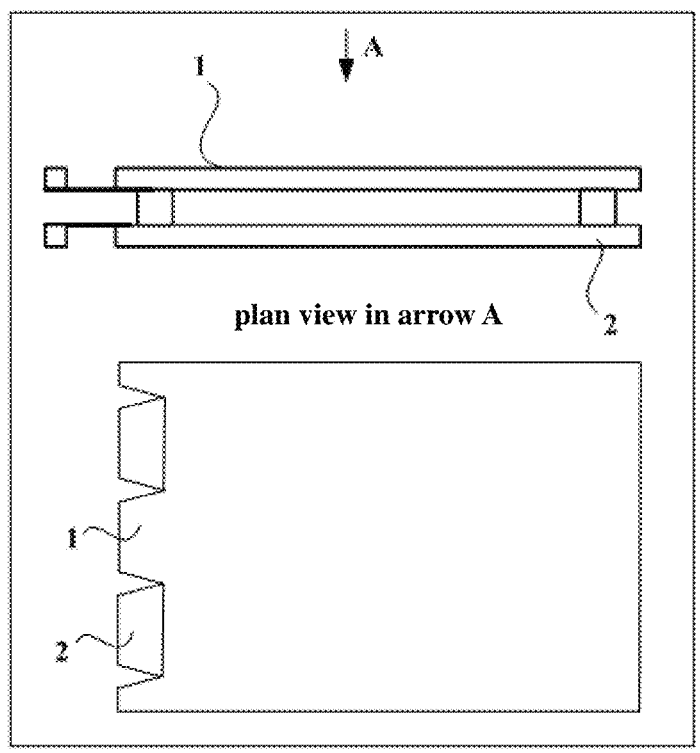
FIG. 7 is an illustrative cross section view of a display panel according to a fifth exemplary embodiment of the present invention.

Please be noted that the above embodiment is only an illustrative example for achieving the electrical connection between the display panels and the driving circuits for the display panels, and the present invention is not limited to the illustrative example. For example, as shown in FIG. 7, in another exemplary embodiment of the present invention, the first array substrate 1 further comprises a first electrical connection region for connecting a driving circuit for the display panel, the second array substrate 2 further comprises a second electrical connection region for connecting the driving circuit, and the first electrical connection region and the second electrical connection region are disposed on the same side of the display panel. As shown in FIG. 7, the first array substrate 1 further comprises a first notch facing the second electrical connection region, and the second array substrate 2 further comprises a second notch facing the first electrical connection region. That is, the first electrical connection region and the second electrical connection region are disposed in a staggered arrangement.

In an exemplary embodiment of another aspect of the present invention, there is provided a display apparatus comprising a display panel according to any one of the above embodiments.

In the display apparatus according to the above exemplary embodiment, coupling capacitances among data lines on each gate line and the gate line is reduced. As a result, attenuation of a signal on each gate line is weakened, increasing a charging rate of each pixel, and improving display quality of the liquid crystal display apparatus.

In an exemplary embodiment of the present invention, the display apparatus may comprise any product or member with a display function, such as, a mobile telephone, a panel computer, a TV, a display, a note book computer, a digital photo frame, a navigating instrument, and so on. Since the display panel of the display apparatus has been described in the above exemplary embodiments, its description is omitted hereafter.

Figure 8:
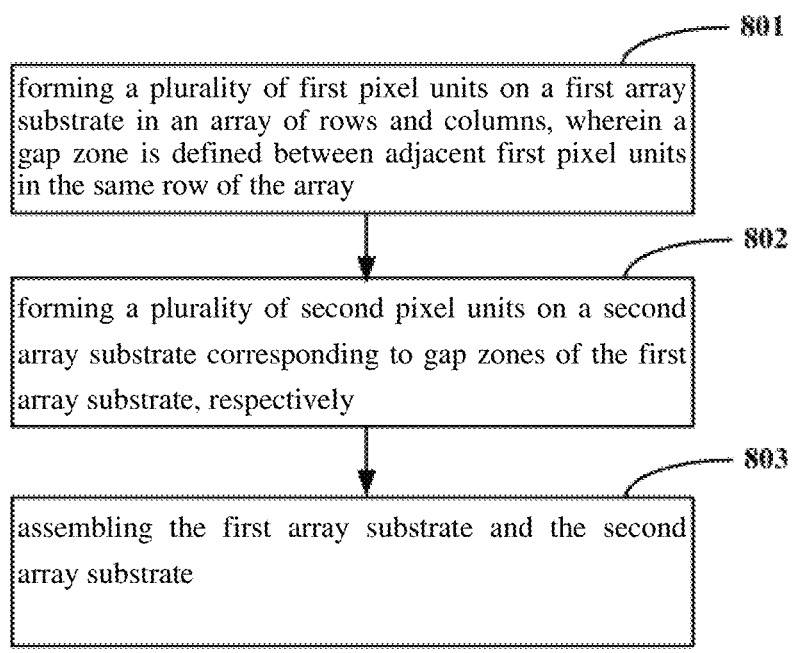
FIG. 8 is an illustrative flow char of manufacturing a display panel according to an exemplary embodiment of the present invention.

In an exemplary embodiment of further aspect of the present invention, there is also provided a method for manufacturing a display panel. FIG. 8 is an illustrative flow char of manufacturing a display panel according to an exemplary embodiment of the present invention. As shown in FIG. 8, the method mainly comprises steps of:

S801: forming a plurality of first pixel units on a first array substrate in an array of rows and columns, wherein a gap zone is defined between two adjacent first pixel units in the same row of the array;

S802: forming a plurality of second pixel units on a second array substrate corresponding to the gap zones of the first array substrate, respectively; and S803: assembling the first array substrate and the second array substrate.

Please be noted that, in this embodiment, it is not necessary to perform the step S801 before the step S802, the step S801 may be performed after the step S802, or the step S801 and the step S802 may be performed at the same time.

In the case that the first array substrate of the display panel further comprises a first electrical connection region for electrically connecting a driving circuit for the display panel, if the second array substrate further comprises a second electrical connection region for connecting the driving circuit, and if the first electrical connection region and the second electrical connection region are disposed on the same side of the display panel, then before the step S803, the above method may further comprise steps of: forming a first notch in the first array substrate produced in the step S801 at a position corresponding to the second electrical connection region of the second array substrate; and forming a second notch in the second array substrate produced in the step S802 at a position corresponding to the first electrical connection region of the first array substrate.

In the case that the display panel is a liquid crystal display panel, then, in an exemplary embodiment of the present invention, a method for manufacturing the liquid crystal display panel may comprise steps of:

S11: forming a color filter on a substrate of a first array substrate;

S12: forming, on the first array substrate formed with the color filter, a plurality of first pixel units arranged in an array of rows and columns, and a plurality of first electrodes each arranged in one corresponding first pixel unit, wherein a gap zone is defined between two adjacent first pixel units in the same row of the array;

S13: forming, on a second array substrate, a plurality of second pixel units corresponding to the gap zones of the first array substrate, respectively, and a plurality of second electrodes each arranged in one corresponding second pixel unit; and S14: filling a liquid crystal layer on the first array substrate produced by the step S12 or the second array substrate produced by the step S13, and assembling the first array substrate and the second array substrate together with a seal adhesive frame.

If the display panel is an OLED panel, then, in another exemplary embodiment of the present invention, a method for manufacturing the OLED panel may comprise steps of:

S21: forming, on a first array substrate, a plurality of first pixel units arranged in an array of rows and columns, and a plurality of transparent electrodes each arranged in one corresponding first pixel unit, wherein a gap zone is defined between two adjacent first pixel units in the same row of the array;

S22: forming a first organic light-emitting layer on each of the transparent electrodes;

S23: forming, on a second array substrate, a plurality of second pixel units corresponding to the gap zones of the first array substrate, respectively, and a plurality of reflection electrodes each arranged in one corresponding second pixel unit;

S24: forming a second organic light-emitting layer on each of the reflection electrodes of the second array substrate produced by the step S23;

S25: forming a first flat layer on the first array substrate produced by the step S22, and forming a second flat layer on the second array substrate produced by the step S24; and S26: assembling the first array substrate and the second array substrate together.

In above embodiment, the first organic light-emitting layer and the second organic light-emitting layer both may be configured to be a color light-emitting layer or a white light-emitting layer. If the first organic light-emitting layer and the second organic light-emitting layer both are configured to be the white light-emitting layer, the above method is needed to further comprise a step of forming a color filter on the substrate of the first array substrate before the step S21.

Also, in above embodiment, the first flat layer and the second flat layer may be coated on the first array substrate and the second array substrate, respectively, by coating.

When the display panel produced by the above methods is in operation, coupling capacitances acted as a load among data lines on each gate line and the gate line is reduced. As a result, attenuation of a signal on each gate line is weakened, increasing a charging rate of each pixel, and improving display quality of the liquid crystal display apparatus.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A display panel comprising a first array substrate and a second array substrate assembled with each other, wherein
   the first array substrate comprises a plurality of first pixel units arranged in an array of rows and columns, and a gap zone is defined between two adjacent first pixel units in the same row of the array;
   the second array substrate comprises a plurality of second pixel units disposed corresponding to the gap zones of the first array substrate, respectively;
   each of the first pixel units comprises a first electrode and a first organic light-emitting layer underneath the first electrode;
   each of the second pixel units comprises a second electrode and a second organic light-emitting layer above the second electrode; and
   the first electrode is configured to be a transparent electrode, and the second electrode is configured to be a reflection electrode.

2. The display panel according to claim 1, wherein the display panel comprises a liquid crystal display panel.

3. The display panel according to claim 1, wherein the display panel comprises an organic electroluminescence display panel.

4. The display panel according to claim 1,
   wherein the first array substrate further comprises a first flat layer formed underneath the first organic light-emitting layer and covering the first array substrate underneath the first array substrate; and
   wherein the second array substrate further comprises a second flat layer formed above the second organic light-emitting layer and covering the second array substrate above the second array substrate.

5. The display panel according to claim 4,
   wherein the first flat layer and the second flat layer are formed of the same material.

6. The display panel according to claim 4, wherein the first flat layer and the second flat layer are formed of an optical adhesive.

7. The display panel according to claim 5,
   wherein the first array substrate further comprises a color filter disposed between a substrate and the first electrode of the first array substrate.

8. The display panel according to claim 1, wherein
   the first array substrate further comprises a first electrical connection region for electrically connecting a driving circuit for the display panel;
   the second array substrate further comprises a second electrical connection region for electrically connecting the driving circuit; and
   the first electrical connection region and the second electrical connection region are disposed on different sides of the display panel.

9. The display panel according to claim 1, wherein
   the first array substrate further comprises a first electrical connection region for electrically connecting a driving circuit for the display panel;
   the second array substrate further comprises a second electrical connection region for electrically connecting the driving circuit; and
   the first electrical connection region and the second electrical connection region are disposed on the same side of the display panel.

10. The display panel according to claim 9,
    wherein the first electrical connection region and the second electrical connection region are disposed in a staggered arrangement.

11. The display panel according to claim 10, wherein
    the first array substrate further comprises a first notch corresponding to the second electrical connection region in position; and
    the second array substrate further comprises a second notch corresponding to the first electrical connection region in position.

12. A display apparatus comprising display panel according to claim 1.

13. A method for manufacturing the display panel according to claim 1, comprising steps of:
    forming a plurality of first pixel units arranged in an array of rows and columns on a first array substrate, wherein a gap zone is defined between two adjacent first pixel units in the same row of the array;
    forming a plurality of second pixel units on a second array substrate corresponding to the gap zones of the first array substrate, respectively; and
    assembling the first array substrate and the second array substrate with each other.

* * * * *